US008848390B2

(12) United States Patent
Jin et al.

(10) Patent No.: US 8,848,390 B2
(45) Date of Patent: Sep. 30, 2014

(54) CAPACITIVE PROXIMITY COMMUNICATION USING TUNED-INDUCTOR

(75) Inventors: Jun-De Jin, Hsinchu (TW); Ming Hsien Tsai, Sindian (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 870 days.

(21) Appl. No.: 13/028,270

(22) Filed: Feb. 16, 2011

(65) Prior Publication Data

US 2012/0208457 A1 Aug. 16, 2012

(51) Int. Cl.
| H05K 1/11 | (2006.01) |
| H05K 1/14 | (2006.01) |
| H01L 23/48 | (2006.01) |
| H01L 25/065 | (2006.01) |
| H01Q 1/22 | (2006.01) |
| H01L 23/64 | (2006.01) |

(52) U.S. Cl.
CPC ... *H01L 25/0657* (2013.01); *H01L 2924/30107* (2013.01); *H01L 23/48* (2013.01); *H01L 2225/06531* (2013.01); *H01L 2924/0002* (2013.01); *H01Q 1/2283* (2013.01); *H01L 23/645* (2013.01); *H01L 2924/30105* (2013.01); *H01L 2924/19042* (2013.01); *H01L 2924/19041* (2013.01)
USPC ........... 361/803; 361/782; 361/784; 361/790; 361/795

(58) Field of Classification Search
USPC ................. 361/760–784, 790, 792–795, 803
See application file for complete search history.

(56) References Cited

U.S. PATENT DOCUMENTS

| 5,629,838 | A | 5/1997 | Knight et al. |
| 5,786,979 | A * | 7/1998 | Douglass ...................... 361/328 |
| 6,175,124 | B1 | 1/2001 | Cole et al. |
| 6,927,490 | B2 | 8/2005 | Franzon et al. |
| 7,319,268 | B2 * | 1/2008 | Watanabe et al. ............. 257/686 |
| 7,489,914 | B2 * | 2/2009 | Govind et al. ............. 455/168.1 |
| 8,064,872 | B2 * | 11/2011 | Dupuis ......................... 455/333 |
| 2004/0034489 | A1* | 2/2004 | Ogino et al. .................... 702/75 |
| 2007/0268094 | A1 | 11/2007 | Kawasaki |
| 2012/0126630 | A1* | 5/2012 | Jin et al. ....................... 307/104 |

FOREIGN PATENT DOCUMENTS

CN 101075696 A 11/2007

OTHER PUBLICATIONS

Mick, S. et al., "4Gbps High-Density AC Coupled Interconnection", IEEE Custom Integrated Circuits Conference, 2002, pp. 133-140.
Drost, R.J. et al., "Proximity Communication", IEEE Journal of Solid-State Circuits, Sep. 2004, 39(9):1529-1535.

* cited by examiner

*Primary Examiner* — Tuan T Dinh
(74) *Attorney, Agent, or Firm* — Duane Morris LLP

(57) ABSTRACT

A multi-chip module includes a chip stack package including at least one pair of stacked dies, the dies having overlapping opposing faces, and at least one capacitive proximity communication (CPC) interconnect between the pair of stacked dies. The CPC interconnect includes a first capacitor plate at a first one of the overlapping opposing faces and a second capacitor plate at a second one of the overlapping opposing faces spaced from and aligned with the first capacitor plate. The CPC interconnect further includes an inductive element connected in series with the first capacitor plate and second capacitor plate, wherein the capacitor plates form part of a capacitor and the capacitor cooperates with the inductor element to form a LC circuit having a resonant frequency.

18 Claims, 4 Drawing Sheets

CAPACITIVE PROXIMITY COMMUNICATION USING TUNED-INDUCTOR

TECHNICAL FIELD

The present disclosure relates to microelectronic devices, and more particularly to packages for microelectronic devices.

BACKGROUND

Microelectronic devices, such as integrated circuit chips, are widely used in consumer and commercial applications. As the integration density of microelectronic devices continues to increase, it may become increasingly difficult to provide a sufficient quantity of high performance interconnects that connect the microelectronic device to a next level package. The interconnects may be used to transfer signals and/or power. Accordingly, the interconnect density and/or performance may be a limiting factor in the further integration of microelectronic devices.

It is known to provide alternating current (AC)-coupled interconnects for microelectronic devices. These AC-coupled interconnects may be characterized by the absence of a direct current (DC) connection. This technique is known as "proximity communication". The technique replaces wired communications between chips with inductive or capacitive interconnect between spaced apart inductive or capacitive elements to provide interconnects. Compared with traditional area ball bonding, proximity communication techniques offer greater density (in terms of connection number/pin number) than ball bonding and increases in communication speed between chips in an electronic system.

With specific reference to capacitive proximity communication interconnects, increasing the capacitance of the proximity communication connections improves the transmission channel. Various approaches are proposed in the prior art to increasing the capacitance of this connection. One such approach involves thinning the substrate of the chips. This approach, however, is difficult to control and costly. Moreover, the roughened substrate surface can lead to capacitance variations from site to site.

A second approach to increasing capacitance of the interconnect is to increase the area of each communication site. This approach is, of course, area hungry and costly.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
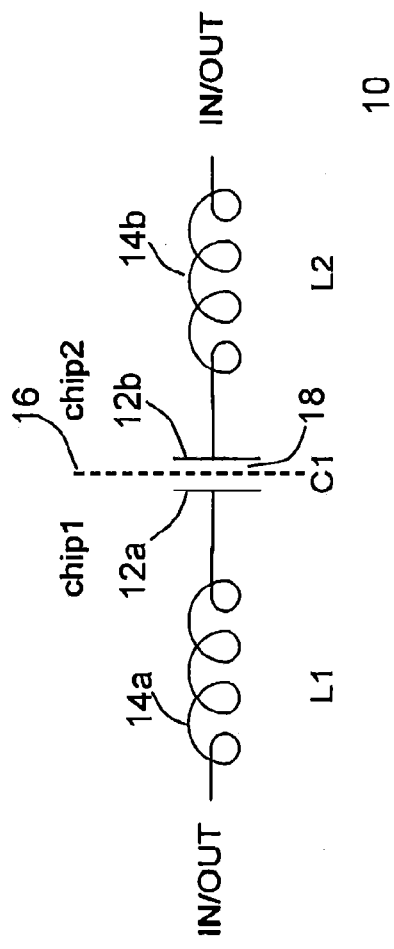
FIG. 1 illustrates an embodiment of an improved capacitive proximity communication (CPC) interconnect.

This description of the exemplary embodiments is intended to be read in connection with the accompanying drawings, which are to be considered part of the entire written description. Terms concerning electrical attachments, coupling and the like, such as "connected", "interconnected," and "coupled" refer to a relationship wherein structures communicate with one another either directly or indirectly through intervening structures, unless expressly described otherwise. In contrast, for example, when an element is referred to as being "directly coupled" to another element, there are no intervening elements present.

In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Interconnect methodologies are largely driven by factors like interconnect density, aggregate bandwidths, signal integrity and power requirements. An array of non-contacting interconnect structures is inherently denser, more compliant and more mechanically robust than an array of contacting structures. Capacitive proximity communication (CPC) interconnects are a promising approach for achieving high data rate interconnections between IC's but improvements are needed. An improved CPC interconnect is described herein.

FIG. 1 illustrates an embodiment of a CPC interconnect 10. In exemplary embodiments, the CPC 10 is used to communicate RF signals between two dies arranged in a multi-chip module containing a chip stack package. With such packages, a carefully designed substrate layout allows multiple dies to be stacked in a vertical configuration making the resultant multi-chip module's footprint much smaller. Since area is more often at a premium in miniature electronics designs, the chip-stack is an attractive option in many applications such as cell phones, personal digital assistants (PDAs) and other small RF devices.

Returning to FIG. 1, FIG. 1 illustrates a CPC interconnect between two chips in a chip stack package. The first chip (labeled chip1) and second chip (labeled chip2) have opposing, overlapping faces falling on either side of dashed line 16. The first chip has a first capacitor plate 12a formed at its face and the second chip has a second capacitor plate 12b formed at its face. The capacitor plates 12a, 12b are spaced from one another by a dielectric and/or semiconductor medium 18, which may be provided on the first and/or second chip. The dielectric medium can comprise silicon dioxide, silicon nitride, polyimide, high dielectric constant materials and/or other dielectric materials. The semiconductor medium can comprise silicon and/or other semiconductor materials. The dielectric layer(s) can fill the gap between the first and second capacitor plates 12a, 12b, and can reduce or prevent spurious shorting between opposing plates. The dielectric medium 18 may alternatively or additionally include a thin air gap. In some embodiments, conventional chip overglass may be used as the dielectric medium, with or without a thin air gap.

One technique for achieving a desired spacing distance between the capacitor plates and for maintaining consistent spacing when plural CPC interconnects are provided between two dies is described in U.S. Pat. No. 6,927,490 to Franzon et al., the entirety of which is hereby incorporated by reference herein. Franzon et al. describes a technique using buried solder bumps to define the spacing between chip faces.

Returning to FIG. 1, the CPC interconnect includes an LC circuit. An LC circuit is a resonant circuit or tuned circuit that consists of an inductor, represented by the letter L, and a capacitor, represented by the letter C. When connected together, an electric current reaches a maximum at the circuit's resonant frequency. The capacitor of the LC is formed by the capacitor plates 12a, 12b and the dielectric medium 18 and is labeled C1 in FIG. 1. The capacitance of the capacitor C1 is determined by the following equation: C=∈ (A/T) where "∈" is the dielectric constant of dielectric medium 18, "A" is the overlapping capacitor plate area and "T" is the plate-to-plate distance.

The inductor of the LC is formed by the inductors 14a, 14b, specifically the sum of the inductances of L1 and L2. As noted above, the CPC interconnect 10 can be used to convey RF signals between dies. By providing inductors 14a, 14b in series with the capacitor C1, thus forming an LC resonant circuit, it is possible to tune the CPC interconnect 10 for a target frequency. The resonant angular frequency "ω" of the LC circuit equals $(LC)^{-1/2}$ and the resonant frequency "f" is ω/(2π). Knowing that L=L1+L2, and assuming that L1=L2, then the value for L1 and L2 given a given target frequency and capacitance is determined by $L=1/(2\omega^2 C)$. Of course, in embodiments, the value of L1 and L2 need not be the same. Indeed, in embodiments, L1 or L2 could be zero (i.e., L1 or L2 could be eliminated) with the remaining inductor providing the total required inductance L.

As shown in FIG. 1, the inductor 14a is electrically in series with the capacitor plate 12a, and the inductor 14b is electrically in series with the capacitor plate 14b. In embodiments, each inductor 14a, 14b is formed as a metal line (spiral or other shape) formed in one or more of the metallization layers that overly the substrate of the respective integrated circuit die. It should be understood that the inductor shape is not important and any shape inductor can be used. In embodiments, the spiral inductor 14a or 14b can be formed in the same layer as the metal plate 12a or 12b. In any event, the inductor is serially connected with the capacitor plate. It should be understood that in the preferred arrangement, the inductors 14a, 14b are insulated or isolated from one another such that they do not serve as inductive proximity communication interconnects. That is, the sole purpose of the inductors is to tune the LC circuit to a target frequency. For example, in embodiments the inductors 14a, 14b can be laterally offset from one another such that they do not inductively communicate with one another, e.g., the two metal plates 12a, 12b overlap one another with inductor 14a disposed to the left of capacitor plate 12a and inductor 14b disposed to the right of capacitor plate 12b.

Figure 3:
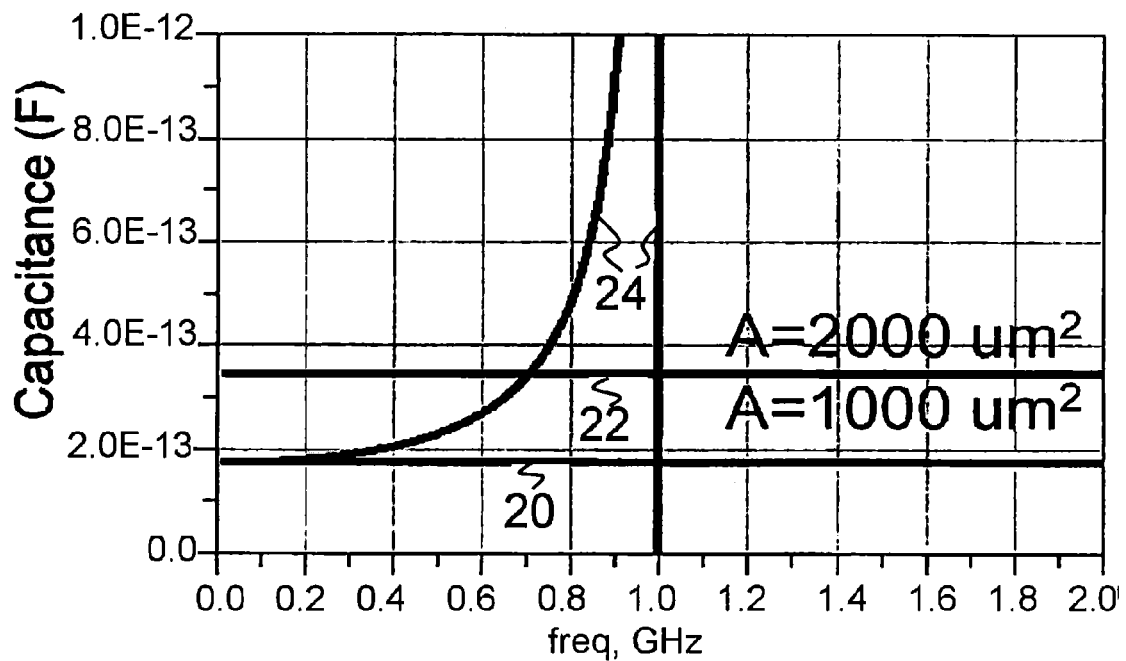
FIG. 3 is a graph comparing the effective capacitance vs. frequency of two conventional CPC interconnects and the CPC interconnect of FIG. 1.

FIG. 3 plots the effective capacitance of a CPC interconnect versus frequency. More specifically, line 20 represents the effective capacitance of a conventional CPC interconnect (i.e., one without a series coupled inductor) where the capacitor has a plate area A of 1000 μm², and line 22 represents the effective capacitance of a conventional CPC interconnect where the capacitor has a plate area A of 2000 μm². As can be seen from FIG. 3, the capacitor size of conventional CPC interconnects must be doubled in order to achieve a doubling in the capacitance value. Plot line 24 illustrates the effective capacitance of a CPC interconnect 10 in accordance with FIG. 1 where an inductor is connected in series with the capacitor to form an LC circuit tuned for a 1.0 GHz RF signal. The effective capacitance of the CPC interconnect increases dramatically toward the resonant frequency.

Figure 4:
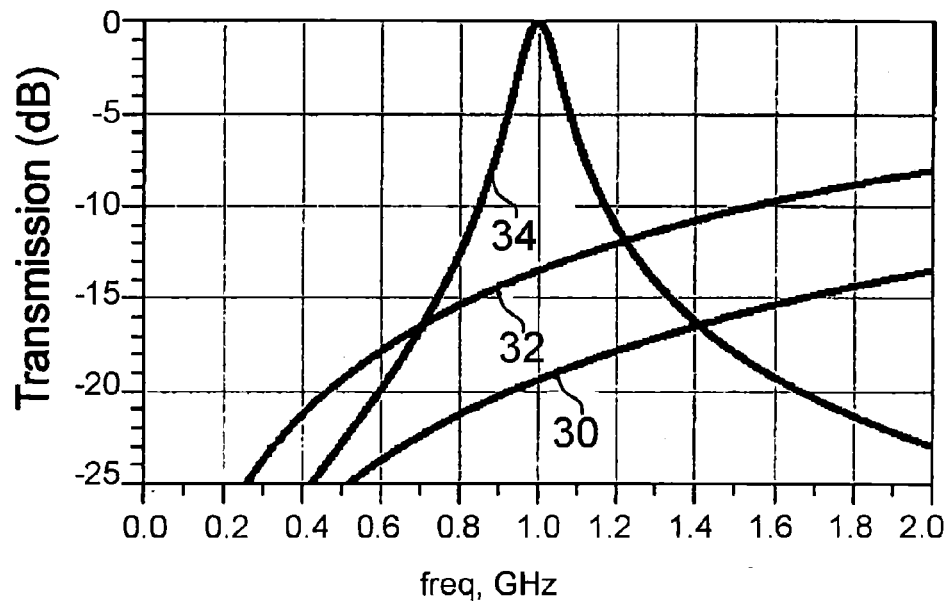
FIG. 4 is a graph comparing the transmission channel performance vs. frequency of the conventional CPC interconnects and the CPC interconnect of FIG. 1.

FIG. 4 is a simulation plot of the transmission channel (in decibels (dB)) of CPC interconnects versus frequency. Line 30 represents a conventional CPC interconnect having a plate area A of 1000 μm², and line 32 represents a conventional CPC interconnect having a plate area A of 2000 μm². By doubling the plate area of the capacitor, the transmission channel realizes about a 6 dB improvement from −19 dB to −13 dB. Line 34 represents the transmission channel of the CPC interconnect in accordance with FIG. 1 where the LC circuit is tuned for 1.0 GHz. As shown in FIG. 4, at 1 GHz, the transmission channel is improved from −19 dB to −0 dB by employing a tuned-inductor. This represents an improvement in the channel performance of almost 900%.

Figure 2:
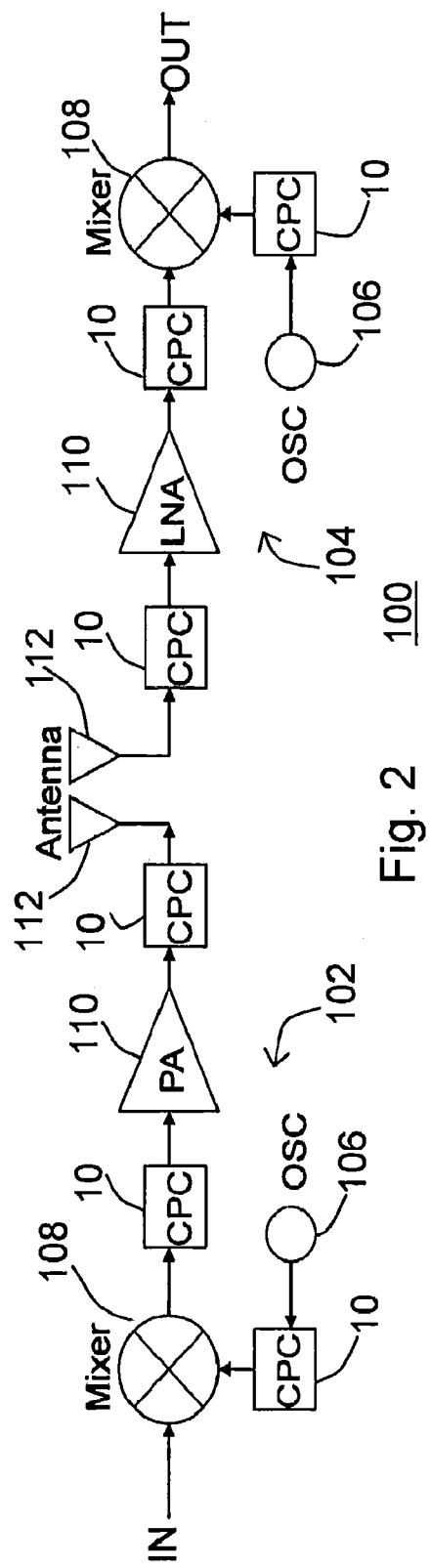
FIG. 2 schematically illustrates a transmitter-receiver system including a pair of multi-chip modules each having plural dies coupled with CPC interconnects as shown in FIG. 1.
Figure 2A:
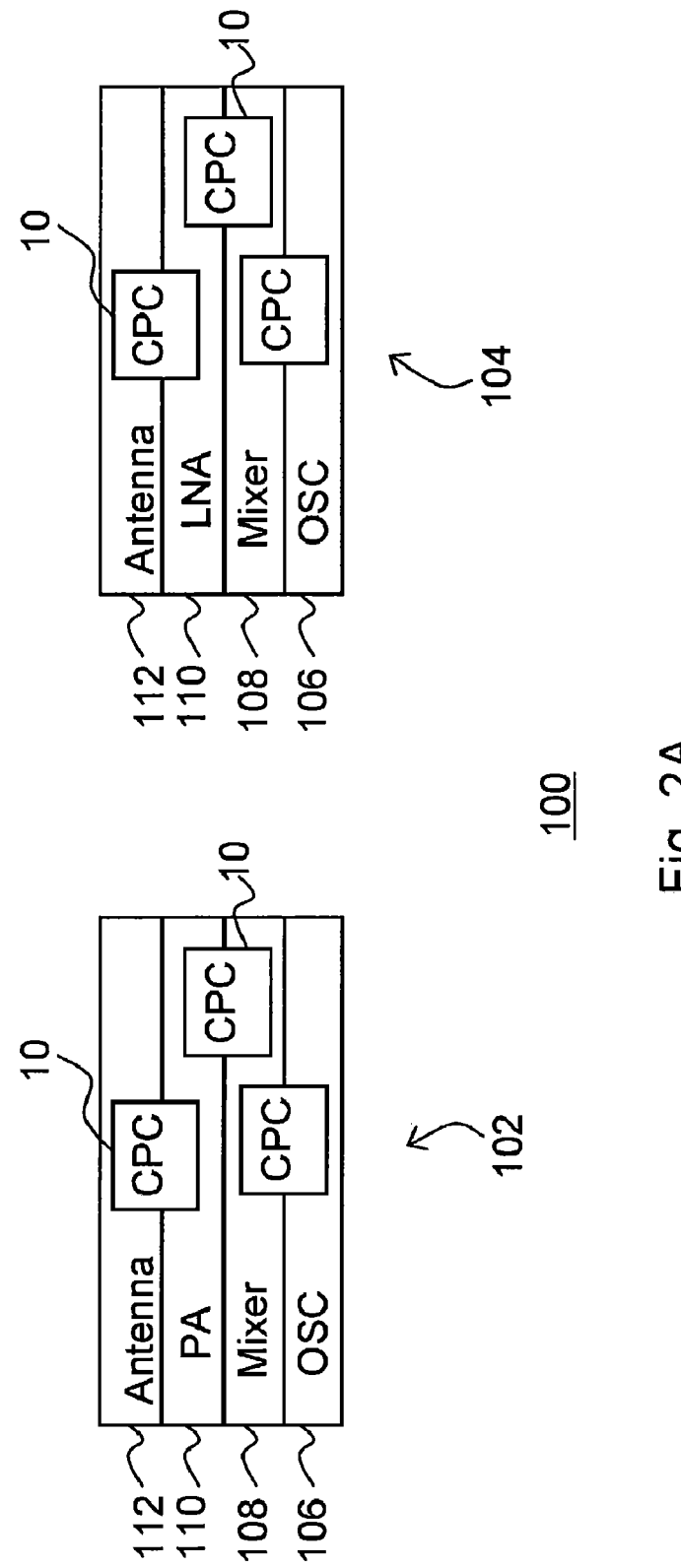
FIG. 2A illustrates two stacks of dies forming the multi-chip modules of FIG. 2's transmitter-receiver system.

FIG. 2 illustrates an RF system 100 including a first multi-chip module 102 and second multi-chip module. Each multi-chip module includes an oscillator 106, a mixer 108, an amplifier 110 and an antenna 112. In module 102, the amplifier 110 is identified as a power amplifier (PA) and in module 104 amplifier 110 is shown as low noise amplifier (LNA). In FIG. 2, the first module 102 is illustrated as a transmitter and the second module is illustrated as a receiver, but it should be understood that the devices can also be configured to operate as transceivers. The first multi-chip module 102 can be included within, for example, a first cellular telephone and the second multi-chip module 104 can be included within, for example, a second cellular telephone. Each of the oscillator 106, mixer 108, amplifier 110 and antenna 112 are formed as separate integrated circuit chip dies that are arranged in a chip stack package. FIG. 2A illustrates the transmitter/receiver system 100 in chip stack form. One or more CPC interconnects 10 is provided as the means for communicating RF signals (e.g., signals in the Gigahertz range) between adjacent stacked dies. It should be understood that the present disclosure is not limited to any particular frequency range and the concepts described herein can be applied to frequencies beyond RF, e.g., frequencies up to 10,000 GHz.

Figure 2B:
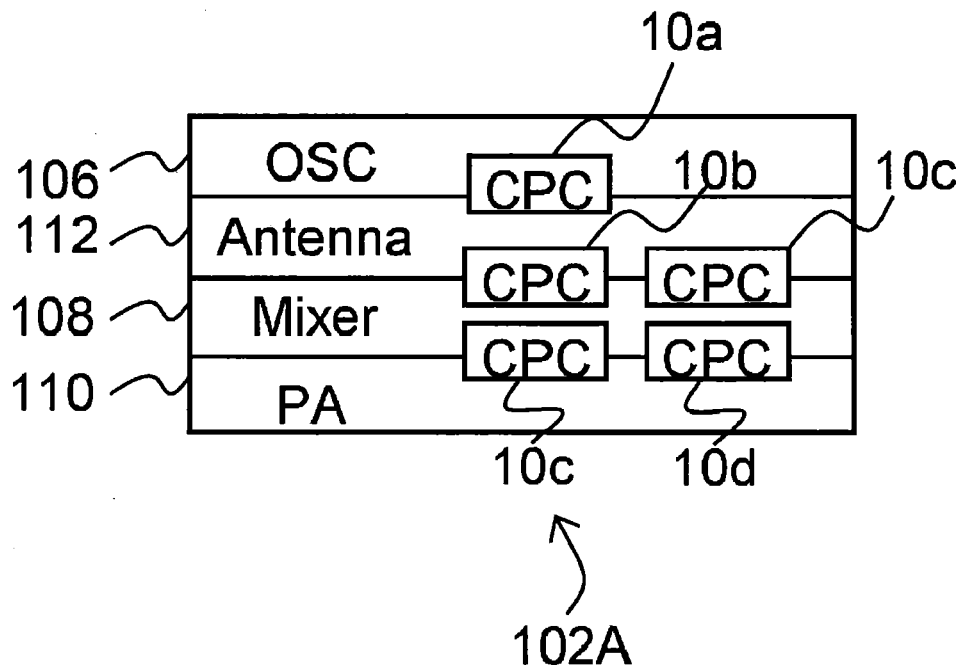
FIG. 2B illustrates a multi-chip module having an alternative arrangement of stacked dies.
Figure 2C:
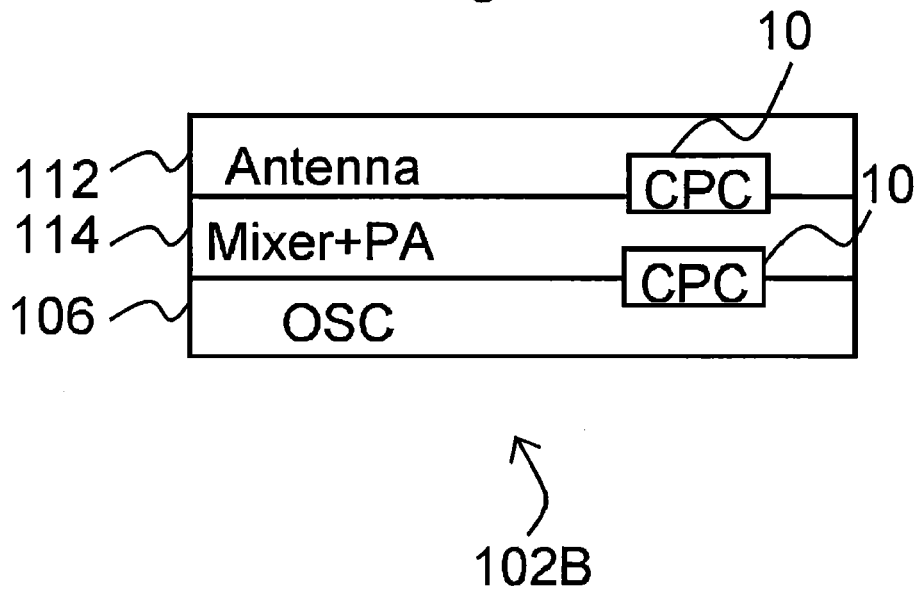
FIG. 2C illustrates a multi-chip module having another alternative arrangement of stacked dies.

Of course, in embodiments, a single integrated circuit die could include more than one of the components illustrated in FIG. 2, in which case the number of dies would be reduced. One such embodiment of a module 102B is shown in FIG. 2C, where the mixer and power amplifier are combined in a die 114. In this embodiment, only two CPC interconnects 10 are required, i.e., a first CPC interconnect 10 to communicate between the oscillator die 106 and the combined mixer/power amplifier die 114 and a second CPC interconnect 10 to communicate between the mixer/power amplifier die 114 and the antenna 112.

It should be understood that depending on the signal requirements of the dies, an array of laterally spaced CPC interconnects 10 could be disposed between adjacent stacked dies for carrying various signals. For example, FIG. 2B shows a module 102A and illustrates that the order of the dies in the stack does not matter. Assuming a stack in the order of power amplifier 110, mixer 108, antenna 112 and oscillator 106, a desired signal flow of oscillator 106, to mixer 108, to power amplifier 110, to antenna 112 can be provided by adding two additional CPC interconnects 10. The signal passing between oscillator 106 and mixer 108 would pass through CPC interconnects 10a and 10b (and an associated signal path through antenna die 112 (not shown)); the signal passing between mixer 108 and power amplifier 110 would use CPC interconnect 10c; and the signal passing from power amplifier 110 to antenna 112 would use CPC interconnects 10d (and an associated path through mixer die 108 (not shown)).

Per the foregoing, an improved transmission channel has been described for chip-to-chip communications in stacked die packages. The transmission channel provides a stronger signal and improved signal at reduced power consumption. Improved performance can be achieved without expensive, delicate processes like substrate thinning and without increasing the footprint of the chip-to-chip interconnections. The improved CPC interconnect can be fabricated using existing manufacturing techniques. Moreover, the CPC interconnect technique requires no additional peripheral circuits, meaning it consumes no additional power.

In embodiments of a multi-chip module, the multi-chip module includes a chip stack package including at least one pair of stacked dies, the dies having overlapping opposing faces, and at least one capacitive proximity communication (CPC) interconnect between the pair of stacked dies. The CPC interconnect includes a first capacitor plate at a first one of the overlapping opposing faces and a second capacitor plate at a second one of the overlapping opposing faces spaced from and aligned with the first capacitor plate. The CPC interconnect further includes an inductive element connected in series with the first capacitor plate and second capacitor plate, wherein the capacitor plates form part of a capacitor and the capacitor cooperates with the inductor element to form a LC circuit having a resonant frequency.

In other embodiments of a multi-chip module, the multi-chip module includes a chip stack package including at least one pair of stacked dies, the dies having overlapping opposing faces, and at least one capacitive proximity communication (CPC) interconnect between the pair of stacked dies. The CPC interconnect includes a LC circuit having a target resonant frequency. The LC circuit includes a capacitor formed from a first capacitor plate at a first one of the overlapping opposing faces, a second capacitor plate at a second one of the overlapping opposing faces spaced from and aligned with the first capacitor plate, and a dielectric medium disposed between the plates, and an inductor element disposed in series with the capacitor. The inductor element includes a first inductor, at the first die, connected in series with the first capacitor plate and a second inductor, at the second die, connected in series with the second capacitor plate, wherein a total inductance of the inductors cooperates with a capacitance value of the capacitor to set the target resonant frequency.

A wireless device is also disclosed and includes oscillator, mixer, amplifier and antenna integrated circuit components. At least two of the integrated components are implemented in a pair of stacked dies arranged in a chip stack package, the dies having overlapping faces, the chip stack package including at least one capacitive proximity communication (CPC) interconnect between the pair of stacked dies. The CPC interconnect includes a first capacitor plate at a first one of the overlapping faces and a second capacitor plate at a second one of the overlapping faces spaced from and aligned with the first capacitor plate. The CPC interconnect also includes an inductive element connected in series with the first capacitor plate and second capacitor plate, wherein the capacitor plates form part of a capacitor and the capacitor cooperates with the inductor element to form a LC circuit having a resonant frequency.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A multi-chip module comprising:
a chip stack package comprising at least one pair of stacked dies, the dies having overlapping opposing faces; and
at least one capacitive proximity communication (CPC) interconnect between the pair of stacked dies, the CPC interconnect comprising a first capacitor plate at a first one of the overlapping opposing faces and a second capacitor plate at a second one of the overlapping opposing faces spaced from and aligned with the first capacitor plate,
the CPC interconnect further comprising an inductive element connected in series with the first capacitor plate and second capacitor plate,
wherein the capacitor plates form part of a capacitor and the capacitor cooperates with the inductor element to form a LC circuit having a resonant frequency;
wherein the inductor element includes a first inductor, at the first die, connected in series with the first capacitor plate and a second inductor, at the second die, connected in series with the second capacitor plate.

2. The multi-chip module of claim 1, wherein the first and second inductors are isolated from one another such that the inductors do not communicate with one another by inductive proximity communication.

3. The multi-chip module of claim 1, wherein each inductor comprises a metal line formed around the capacitor plate to which the inductor is connected.

4. The multi-chip module of claim 1, wherein each inductor is designed to have the same inductance value.

5. The multi-chip module of claim 1, wherein the resonant frequency is 1.0 gigahertz or greater.

6. The multi-chip module of claim 1, wherein the dies are operable to communicate an RF signal via the CPC interconnect.

7. The multi-chip module of claim 1, wherein the dies form part of a wireless transmitter, receiver or transceiver.

8. The multi-chip module of claim 2, wherein the inductors are laterally offset from one another such that the inductors do not overlap.

9. A wireless device comprising:
oscillator, mixer, amplifier and antenna integrated circuit components,
wherein at least two of the integrated circuit components are implemented in a pair of stacked dies arranged in a chip stack package, the dies having overlapping opposing faces, the chip stack package including at least one capacitive proximity communication (CPC) interconnect for coupling signals between the pair of stacked dies,
the CPC interconnect comprising a first capacitor plate at a first one of the overlapping opposing faces and a second capacitor plate at a second one of the overlapping opposing faces spaced from and aligned with the first capacitor plate, wherein the capacitor plates form part of a capacitor,
the CPC interconnect further comprising an inductive element connected in series with the capacitor,
wherein the capacitor cooperates with the inductor element to form a LC circuit having a resonant frequency;
wherein the inductor element includes a first inductor, at the first die, connected in series with the first capacitor plate and a second inductor, at the second die, connected in series with the second capacitor plate.

10. The wireless device of claim 9, wherein the multi-chip module comprises three or more stacked dies corresponding m the oscillator, mixer, amplifier and antenna integrated circuit components, the at least one CPC interconnect comprising a plurality of CPC interconnects, the CPC interconnects coupling each die to an adjacent die in the chip stack package for communicating signals therebetween.

11. The wireless device of claim 9, wherein the resonant frequency is 1.0 gigahertz or greater.

12. The wireless device of claim 9, wherein the dies are operable to communicate RF signals via the CPC interconnect.

13. The wireless device of claim 9, wherein the first and second inductors are laterally offset from one another such that the inductors do not overlap, whereby the inductors do not communicate with one another by inductive proximity communication.

14. The wireless device of claim 9, wherein each inductor comprises a metal line formed around the capacitor plate to which the inductor is connected.

15. The multi-chip module of claim 9, wherein the wireless device is a wireless transmitter, receiver or transceiver.

16. A multi-chip module comprising:
  a chip stack package comprising at least one pair of stacked dies, the dies having overlapping opposing faces; and
  at least one capacitive proximity communication (CPC) interconnect between the pair of stacked dies, the CPC interconnect comprising a LC circuit having a target resonant frequency, the LC circuit including:
    a capacitor formed from a first capacitor plate at a first one of the overlapping opposing faces, a second capacitor plate at a second one of the overlapping opposing faces spaced from and aligned with the first capacitor plate, and a dielectric medium disposed between the plates, and
    an inductor element disposed in series with the capacitor, the inductor element comprising a first inductor, at the first die, connected in series with the first capacitor plate and a second inductor, at the second die, connected in series with the second capacitor plate, wherein a total inductance of the inductors cooperates with a capacitance value of the capacitor to set the target resonant frequency.

17. The multi-chip module of claim 16, wherein the resonant frequency is 1.0 gigahertz or greater.

18. The multi-chip module of claim 16, wherein each inductor is designed to have the same inductance value.

* * * * *

UNITED STATES PATENT AND TRADEMARK OFFICE
CERTIFICATE OF CORRECTION

PATENT NO. : 8,848,390 B2  
APPLICATION NO. : 13/028270  
DATED : September 30, 2014  
INVENTOR(S) : Jun-De Jin et al.

Page 1 of 1

It is certified that error appears in the above-identified patent and that said Letters Patent is hereby corrected as shown below:

In the Claims:

Claim 10, Column 6, Line 67 - delete "m" and insert -- to --.

Signed and Sealed this
Fourth Day of August, 2015

Michelle K. Lee
*Director of the United States Patent and Trademark Office*